United States Patent
Kim et al.

(10) Patent No.: US 10,263,054 B2
(45) Date of Patent: Apr. 16, 2019

(54) ORGANIC LIGHT-EMITTING DISPLAY APPARATUS

(71) Applicant: Samsung Display Co., Ltd., Yongin-si, Gyeonggi-do (KR)

(72) Inventors: Hyunyoung Kim, Yongin-si (KR); Dohoon Kim, Yongin-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 80 days.

(21) Appl. No.: 14/969,251

(22) Filed: Dec. 15, 2015

(65) Prior Publication Data

US 2016/0225834 A1    Aug. 4, 2016

(30) Foreign Application Priority Data

Jan. 30, 2015    (KR) .................... 10-2015-0015577

(51) Int. Cl.
*H01L 27/32* (2006.01)

(52) U.S. Cl.
CPC ...... *H01L 27/3246* (2013.01); *H01L 27/3216* (2013.01); *H01L 27/3218* (2013.01); *H01L 27/3258* (2013.01)

(58) Field of Classification Search
None
See application file for complete search history.

(56) References Cited

U.S. PATENT DOCUMENTS

| | | | |
|---|---|---|---|
| 2002/0149720 A1 | 10/2002 | Janssen et al. | |
| 2007/0200488 A1* | 8/2007 | Ito | F21K 2/06 313/500 |
| 2009/0058271 A1 | 3/2009 | Koo et al. | |
| 2009/0121983 A1* | 5/2009 | Sung | H01L 27/3216 345/76 |
| 2010/0033084 A1 | 2/2010 | Ko et al. | |
| 2013/0021566 A1* | 1/2013 | Akitomo | G02F 1/13394 349/108 |
| 2014/0111757 A1 | 4/2014 | Komatsu et al. | |
| 2014/0197396 A1* | 7/2014 | Madigan | H01L 51/0005 257/40 |
| 2014/0252321 A1* | 9/2014 | Pyon | H01L 27/3216 257/40 |
| 2014/0319479 A1* | 10/2014 | Park | H01L 51/525 257/40 |
| 2016/0225833 A1* | 8/2016 | Kim | H01L 27/3246 |

FOREIGN PATENT DOCUMENTS

| | | |
|---|---|---|
| KR | 2003-0007960 | 1/2003 |
| KR | 10-2009-0021714 | 3/2009 |
| KR | 10-2010-0003243 | 1/2010 |
| KR | 10-2010-0095986 | 9/2010 |
| KR | 10-2014-0050546 | 4/2014 |

\* cited by examiner

*Primary Examiner* — Shaun M Campbell
*Assistant Examiner* — Aneta B Cieslewicz

(57) ABSTRACT

An organic light-emitting display apparatus includes a thin-film transistor on a substrate, a planarization layer on the thin-film transistor, and a pixel-defining spacer on the planarization layer. The pixel-defining spacer defines a pixel area between two pixels that are adjacent in a first direction.

15 Claims, 5 Drawing Sheets

ORGANIC LIGHT-EMITTING DISPLAY APPARATUS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2015-0015577, filed on Jan. 30, 2015, in the Korean Intellectual Property Office, the disclosure of which is incorporated herein in its entirety by reference.

BACKGROUND

Field

One or more embodiments relate to organic light-emitting display apparatuses.

Description of the Related Technology

Organic light-emitting display apparatuses are self-emission display apparatuses which have an organic light-emitting device including a hole injection electrode, an electron injection electrode, and an organic emission layer formed between the hole injection electrode and the electron injection electrode, and emit light when excitons generated by combining holes injected from the hole injection electrode and electrons injected from the electron injection electrode inside the organic emission layer drop from an excited state to a ground state.

As organic light-emitting display apparatuses have self-emitting characteristics, they do not require a separate light source. Thus, the organic light-emitting display apparatuses may be driven at a low voltage, be formed to be lightweight and thin, and have high-quality characteristics such as wide view angles, good contrast, and quick response times. Accordingly, such apparatuses have drawn attention as next-generation display apparatuses.

SUMMARY OF CERTAIN INVENTIVE ASPECTS

One or more embodiments include an organic light-emitting display apparatus.

Additional aspects will be set forth in part in the description which follows and, in part, will be apparent from the description, or may be learned by practice of the presented embodiments.

According to one or more embodiments, an organic light-emitting display apparatus includes: a thin-film transistor on a substrate; a planarization layer on the thin-film transistor; and a pixel-defining spacer on the planarization layer, wherein the pixel-defining spacer defines a pixel area and is between two pixels adjacent in a first direction.

The two adjacent pixels may be blue.

Among the blue pixels in the pixel area, a first gap between first two neighboring blue pixels and a second gap between second two neighboring blue pixels may be alternately and regularly formed, the first gap may be different from the second gap, and the pixel-defining spacer may be formed in a region in which a gap between two neighboring blue pixels is wide.

The pixel-defining spacer may be between two green pixels adjacent in a second direction and between two red pixels adjacent in the second direction, wherein the second direction is perpendicular to the first direction.

The pixel-defining spacer may be rectangular shaped.

The pixel-defining spacer may be lozenge shaped.

The pixel-defining spacer may be spaced apart from the blue pixels by at least about 8 μm.

The pixel-defining spacer may be spaced apart from green pixels or red pixels by at least about 9.2 μm.

The pixel-defining spacer may be hexagonal shaped.

The pixel-defining spacer may be spaced apart from the blue pixels by at least 9 μm.

The pixel-defining spacer may be spaced apart from green pixels or red pixels by at least about 9.6 μm.

Blue pixels in the pixel area may be formed such that two different gaps, each gap between two neighboring blue pixels, are alternately and regularly formed, and the pixel-defining spacer may be formed in different shapes in a region in which a gap between a first two neighboring blue pixels is narrow and in a region in which a gap between a second two neighboring blue pixels is wide.

The pixel-defining spacer may be trapezoidal shaped in the region in which a gap between two neighboring blue pixels is narrow.

The top of the trapezoidal shaped pixel-defining spacer may be located between the two blue pixels, and the bottom of the trapezoidal shaped pixel-defining spacer may be located between adjacent green and red pixels.

The pixel-defining spacer may be quadrilateral shaped in the region in which a gap between two neighboring blue pixels is wide.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
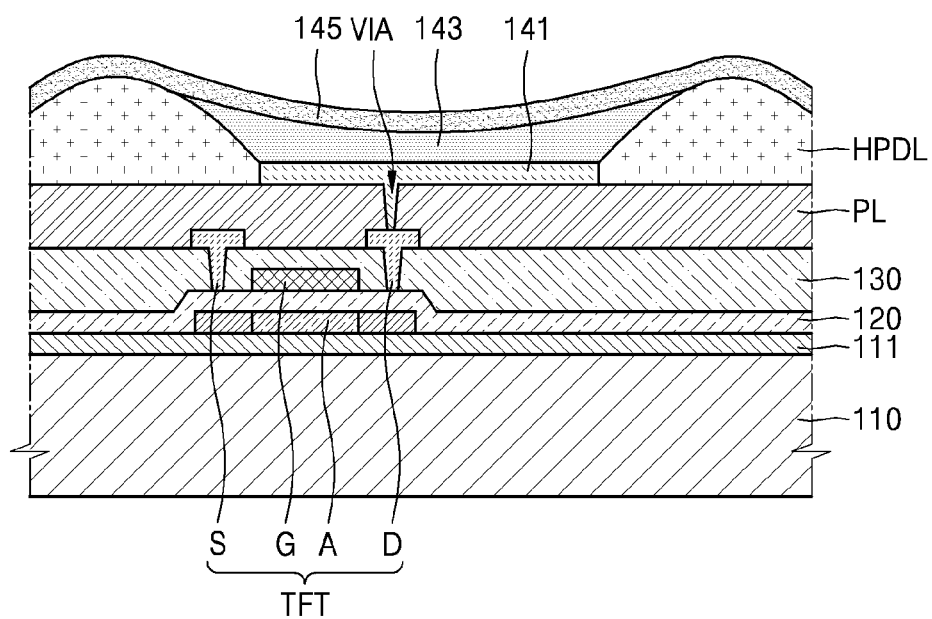
FIG. 1 illustrates a cross-sectional view of an organic light-emitting display apparatus according to an embodiment.

Reference will now be made in detail to embodiments, examples of which are illustrated in the accompanying drawings, wherein like reference numerals generally refer to like elements throughout. In this regard, the embodiments may have different forms and should not be construed as being limited to the descriptions set forth herein. Accordingly, the embodiments are merely described below, by referring to the figures, to explain aspects of the present description.

It will be understood that although the terms "first", "second", and the like may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. For example, intervening layers, regions, or components may also be present.

Sizes of elements in the drawings may be exaggerated for convenience of explanation. In other words, since sizes and thicknesses of components in the drawings are arbitrarily illustrated for convenience of explanation, the embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a cross-sectional view of one pixel circuit of a thin-film transistor array substrate included in an organic light-emitting display apparatus according to an embodiment.

The thin-film transistor array substrate includes at least one thin-film transistor. The thin-film transistor array substrate may include a plurality of regularly arranged thin-film transistors TFT, a plurality of irregularly arranged thin-film transistors TFT, or one thin-film transistor TFT.

As shown in FIG. 1, the one pixel circuit may include a substrate 110, a thin-film transistor TFT on the substrate 110, and a planarization layer PL on the thin-film transistor TFT.

Referring to FIG. 1, a buffer layer 111 may be formed on the substrate 110. The buffer layer 111 may act as a barrier layer and/or a blocking layer for preventing the spread of impurity ions, preventing the infiltration of humidity or external air, and for planarizing the surface of the substrate 110.

A semiconductor layer A of the thin-film transistor TFT is formed on the buffer layer 111. The semiconductor layer A may include polysilicon and may include a channel region undoped with impurities, and source and drain regions doped with the impurities and respectively located at both sides of the channel region. The impurities may vary depending on a type of the thin-film transistor TFT, and may be N- or P-type impurities.

A gate insulating layer 120 may be stacked on the entire surface of the substrate 110 to cover the semiconductor layer A. The gate insulating layer 120 may include an inorganic material, such as, for example, silicon oxide, silicon nitride, or the like, and in a multi-layer or a single layer. The gate insulating layer 120 insulates between the semiconductor layer A and a gate electrode G of the thin-film transistor TFT.

A material of the gate electrode G may include one or more of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), or copper (Cu).

An interlayer insulating layer 130 is formed on the entire surface of the substrate 110 to cover the gate electrode G.

The interlayer insulating layer 130 may include an inorganic material or an organic material. According to one or more embodiments, the interlayer insulating layer 130 may include an inorganic material. For example, the interlayer insulating layer 130 may include metal oxide or metal nitride, and the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The interlayer insulating layer 130 may include an inorganic material of silicon oxide ($SiO_x$) and/or silicon nitride ($SiN_x$), or the like and in a multi-layer or a single layer. According to one or more embodiments, the interlayer insulating layer 130 may be formed in a double structure of SiOx/SiNy or SiNx/SiOy.

The interlayer insulating layer 130 insulates the gate electrode G from wirings formed on the interlayer insulating layer 130.

A source electrode S and a drain electrode D of the thin-film transistor TFT respectively connected to the source region and the drain region doped with the impurities in the semiconductor layer A may be formed on the interlayer insulating layer 130. In other embodiments, the source electrode S and the drain electrode D may be in the same layer as the semiconductor layer A. That is, the source electrode S and the drain electrode D of the thin-film transistor TFT may include polysilicon selectively doped with a doping material.

The planarization layer PL is formed on the entire surface of the substrate 110 to cover a plurality of wirings, the source electrode S, and the drain electrode D formed on the interlayer insulating layer 130. A pixel electrode 141 may be formed on the planarization layer PL. The pixel electrode 141 is connected to the drain electrode D or the source electrode S of the thin-film transistor TFT through a via hole VIA.

The planarization layer PL may include an insulating material. For example, the planarization layer PL may include an inorganic material, an organic material, or an organic/inorganic compound, in a single- or multi-layer structure, and by various deposition methods. According to one or more embodiments, the planarization layer PL may include one or more materials of polyacrylates resin, epoxy resin, phenolic resin, polyamides resin, polyimides rein, unsaturated polyesters resin, poly phenylenethers resin, poly phenylenesulfides resin, and benzocyclobutene (BCB).

An intermediate layer 143, which includes an organic emission layer, and an opposite electrode 145 may be formed on the pixel electrode 141, and the pixel electrode 141, the intermediate layer 143, and the opposite electrode 145 are components of an organic light-emitting diode (OLED).

The pixel electrode 141 may fill the via hole VIA in the planarization layer PL and may be electrically connected to the source electrode S or the drain electrode D of the thin-film transistor TFT. The pixel electrode 141 and/or the opposite electrode 145 may be a transparent electrode or a reflective electrode. For the transparent electrode, the pixel electrode 141 and/or the opposite electrode 145 may include indium tin oxide (ITO), indium zinc oxide (IZO), zinc oxide (ZnO), or indium oxide ($In_2O_3$). For the reflective electrode, the pixel electrode 141 and/or the opposite electrode 145 may include a reflective layer including Ag, Mg, Al, Pt, Pd, Au, Ni, Nd, Ir, Cr, a compound thereof, or the like, and a transparent layer including ITO, IZO, ZnO, or $In_2O_3$. According to one or more embodiments, the pixel electrode 141 or the opposite electrode 145 may have an ITO/Ag/ITO structure.

As described above, the pixel electrode 141, the intermediate layer 143, and the opposite electrode 145 form the OLED. Holes and electrons injected from the pixel electrode 141 and the opposite electrode 145 of the OLED may be combined in the organic emission layer of the intermediate layer 143, thereby emitting light.

The intermediate layer 143 may include an organic emission layer. As another example, the intermediate layer 143 may include the organic emission layer and may further include at least one of a hole injection layer (HIL), a hole transport layer (HTL), an electron transport layer (ETL), and an electron injection layer (EIL). In other embodiments, the intermediate layer 143 may include the organic emission layer and may further include other various function layers. The opposite electrode 145 is formed on the intermediate layer 143. The opposite electrode 145 forms an electric field together with the pixel electrode 141 so that the intermediate layer 143 emits light. The pixel electrode 141 may be patterned for each pixel, and the opposite electrode 145 may be formed over all pixels such that a common voltage is applied to all the pixels.

Each of the pixel electrode 141 and the opposite electrode 145 may be a transparent electrode or a reflective electrode. The pixel electrode 141 may function as an anode electrode, and the opposite electrode 145 may function as a cathode electrode. In other embodiments, the pixel electrode 141 may function as a cathode electrode, and the opposite electrode 145 may function as an anode electrode.

Although only one OLED is shown in FIG. 1, a display panel may include a plurality of OLEDs. One pixel may be formed for each OLED, and a red, green, blue, or white color may be realized for each pixel, as an example.

In other embodiments, the intermediate layer 143 may be commonly formed for the whole pixel electrodes 141 regardless of a position of each pixel. In this case, the organic emission layer may be formed such that layers respectively including emission materials emitting red, green, and blue lights are vertically stacked or are mixed. Alternatively, other colors may be combined if white light is emitted. In addition, a color conversion layer or a color filter for converting the emitted white light into a predetermined color may be further included.

In addition, the organic light-emitting display apparatus may further include a pixel-defining spacer HPDL on the planarization layer PL.

The pixel-defining spacer HPDL in one embodiment indicates a component which performs both the role of a pixel-defining layer for defining a pixel area and a non-pixel area, and the role of a spacer for maintaining a gap between the substrate 110 and a sealing substrate (not shown).

Therefore, the organic light-emitting display apparatus according to embodiments herein includes the pixel-defining spacer HPDL capable of performing both roles, and thus time and costs are saved in terms of a process.

The pixel-defining spacer HPDL may include an opening through which the pixel electrode 141 is exposed and may be formed to cover all over the substrate 110. As shown in FIG. 1, the intermediate layer 143 may be formed in the opening such that the opening substantially becomes a pixel area.

The pixel-defining spacer HPDL may be disposed between pixel areas to define a pixel area and a non-pixel area, and may protrude towards the top as shown in FIG. 1.

Since the pixel-defining spacer HPDL performs both the role of a pixel-defining layer and the role of a spacer, the pixel-defining spacer HPDL may protrude towards the top to have a sufficient height. Accordingly, the pixel-defining spacer HPDL may maintain the gap between the substrate 110 and the sealing substrate (not shown) on the substrate 110, and may also prevent a decrease in a display characteristic due to an external shock.

Although FIG. 1 shows a shape of the pixel-defining spacer HPDL according to one embodiment, the shape of the pixel-defining spacer HPDL is not limited thereto, and any shape may be applied thereto if the shape sufficiently performs both the role of a pixel-defining layer and the role of a spacer.

The pixel-defining spacer HPDL may be formed by stacking an insulating material which may include an organic material or an inorganic material. The organic material may include one of BCB, an acrylic photoresist, a phenolic photoresist, a polyimides photoresist, or other photosensitive resins. However, embodiments are not limited thereto.

Figure 2:
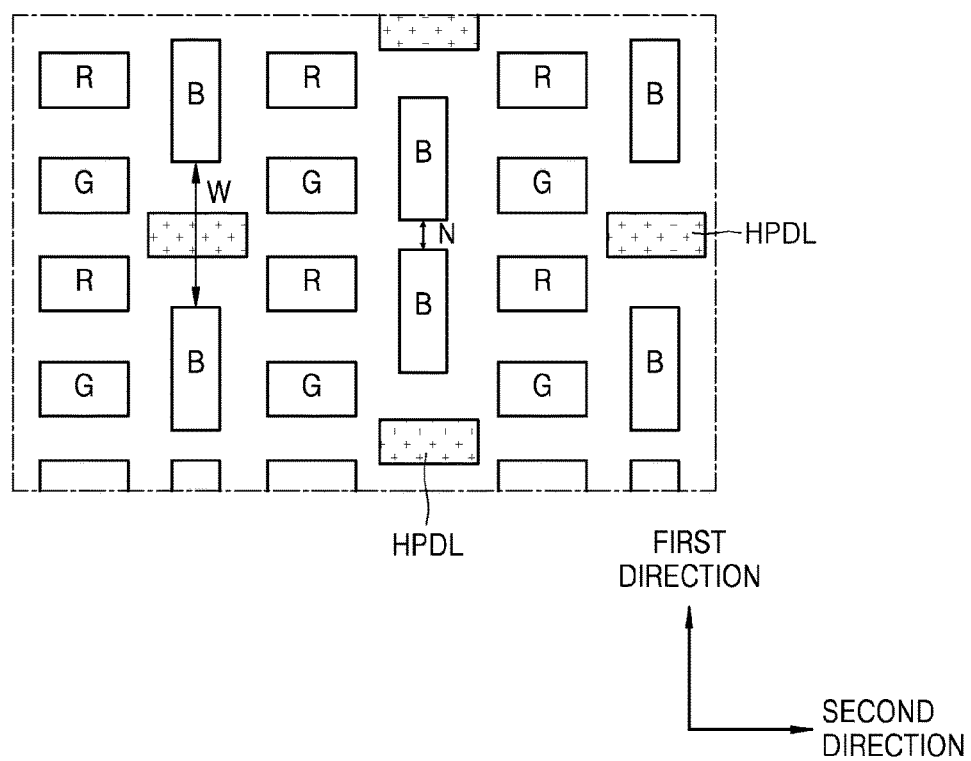
FIG. 2 illustrates a top view of an organic light-emitting display apparatus according to an embodiment.

FIG. 2 illustrates a top view of an organic light-emitting display apparatus according to an embodiment. FIG. 2 shows only a plurality of color pixels R, G, and B and pixel-defining spacers HPDL for convenience of description.

As shown in FIG. 2, in one example, each pixel-defining spacer HPDL may be formed between two neighboring blue pixels B.

When it is defined, as in FIG. 2, that a vertical direction is a first direction and a horizontal direction that is perpendicular to the first direction is a second direction, each pixel-defining spacer HPDL may be formed between two blue pixels B neighboring in the first direction.

A thin-film transistor array substrate may be formed such that blue pixels B in a pixel area have different gaps therebetween, while gaps between red pixels R and green pixels G remain constant.

That is, unlike the arrangement of the red pixels R and the green pixels G with a constant gap therebetween, the blue pixels B may be regularly arranged such that gaps between two neighboring blue pixels B maintain two gaps, W and N.

Referring to FIG. 2, the blue pixels B may be alternately arranged such that gaps between two neighboring blue pixels B maintain a relatively wide gap W, and a relatively narrow gap N.

In this case, as described above, the pixel-defining spacer HPDL may be formed between two neighboring blue pixels B. The pixel-defining spacer HPDL may be formed between two blue pixels B maintaining the relatively wide gap W therebetween.

Commonly, in the existing organic light-emitting display apparatus, a spacer is formed between a red pixel R and a green pixel G. However, in this case, since a gap between the spacer and each pixel cannot be sufficiently secured, a dark spot may be generated due to a stabbing effect.

Accordingly, in the organic light-emitting display apparatus according to embodiments herein described, the pixel-defining spacer HPDL is formed between two neighboring blue pixels B located to sufficiently secure a gap therebetween to solve the dark spot problem.

The relatively wide gap W of the gaps between two neighboring blue pixels B may be about 67.5 μm, and the relatively narrow gap N may be about 12.5 μm. The gap between neighboring red and green pixels R and G may be about 27.5 μm.

Of course, the above-described numeric values of the gaps between the pixels R, G, and B are only illustrative, and embodiments are not limited thereto.

By forming the pixel-defining spacer HPDL between two blue pixels B having a maximum gap W therebetween, a space is well used, and by maximizing a distance between the pixel-defining spacer HPDL and an opening region, a damage of a pixel due to an external shock may be prevented when a partial shock is applied.

Referring to FIG. 2, in one embodiment of the organic light-emitting display apparatus, the pixel-defining spacer HPDL may be formed between two neighboring blue pixels B such that a region between a green pixel G and a red pixel R, and a region between another green pixel G and another red pixel R are respectively located to the left and right of the pixel-defining spacer HPDL.

The pixel-defining spacer HPDL may be formed between two neighboring green pixels G and between two neighboring red pixels R in the second direction that is perpendicular to the first direction. In particular, the pixel-defining spacer HPDL may be formed in a space between neighboring green pixels G and red pixels R.

The pixel-defining spacer HPDL may be formed between blue pixels B spaced apart by the gap W which is relatively wide with respect to gaps between blue pixels B adjacent to one another in the first direction that is the vertical direction in FIG. 2. The pixel-defining spacer HPDL may be formed at the same location as a location between neighboring red and green pixels R and G. In addition, the pixel-defining spacer HPDL may be formed in a region between two neighboring green pixels G and between two neighboring red pixels R in the second direction that is perpendicular to the first direction.

Therefore, the pixel-defining spacer HPDL may be located in a vacant space around pixels R, G, and B without pixels R, G, and B in the left and right regions of the pixel-defining spacer HPDL in the second direction.

Accordingly, a predetermined gap is maintained in the vertical direction of the pixel-defining spacer HPDL, and a vacant space without pixels is formed to the left and right of the pixel-defining spacer HPDL, and thus, even if the pixel-defining spacer HPDL moves due to an external shock, the pixel-defining spacer HPDL does not move to an opening region, and accordingly, a deposited object may be prevented from being stabbed.

As shown in FIG. 2, the pixel-defining spacer HPDL may be formed in a rectangular shape, but is not limited thereto.

In addition, distances from the pixel-defining spacer HPDL to a blue pixel B, to a red pixel R, and to a green pixel G may be variously adjusted.

As described above, compared with the existing thin-film transistor array substrate, distances from the pixel-defining spacer HPDL to nearby pixels may be maximized, and thus a slip distance of the pixel-defining spacer HPDL may be secured to thereby prevent a partial shock, and even when the pixel-defining spacer HPDL moves, the pixel-defining spacer HPDL does not move to an opening region, and thus a deposited object may be prevented from being stabbed.

Figure 3:
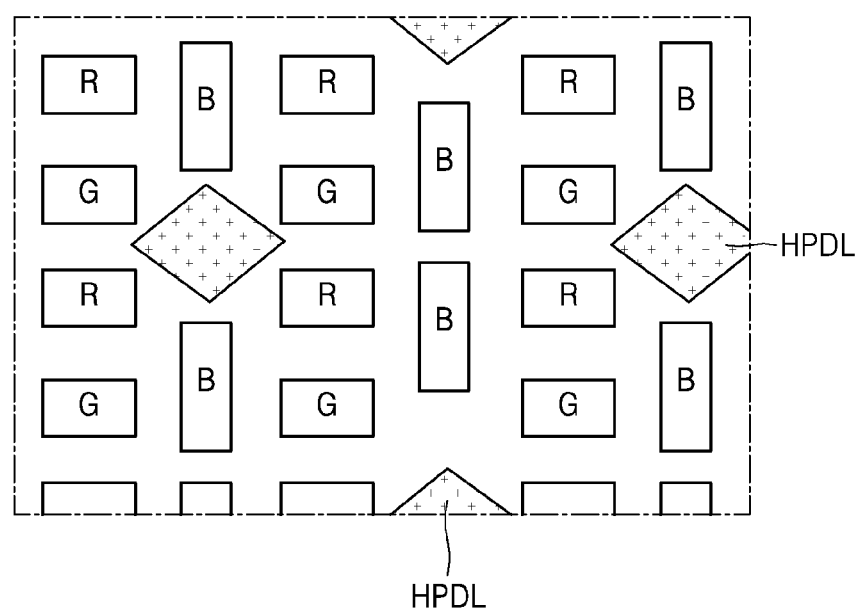
FIG. 3 illustrates a top view of an organic light-emitting display apparatus according to another embodiment.

FIG. 3 illustrates a top view of a thin-film transistor array substrate according to another embodiment. In FIG. 3, like reference numerals in FIGS. 1 and 2 refer to like elements, and the description thereof is not repeated for conciseness of the description.

In one embodiment of an organic light-emitting display apparatus, the pixel-defining spacer HPDL may be formed in a lozenge shape. Accordingly, the pixel-defining spacer HPDL may be formed by maximally using a vacant space between pixels while maintaining a minimum distance to a pixel as a predetermined gap.

As shown in FIG. 3, when the pixel-defining spacer HPDL is formed in a lozenge shape, a vacant space between pixels may be maximally used, and thus a size of the pixel-defining spacer HPDL may be relatively large.

By forming the pixel-defining spacer HPDL in a lozenge shape on the thin-film transistor array substrate, a minimum distance to blue pixels B in the vertical direction may be maintained as about 8 μm, and a minimum distance to red and green pixels R and G in the horizontal direction may be maintained as about 9.6 μm.

The above-described numeric values as the distances to the blue, red, and green pixels B, R, and G are only illustrative, and embodiments are not limited thereto. In addition, the numeric values may be variously adjusted if the pixel-defining spacer HPDL is formed at the location described above.

Figure 4:
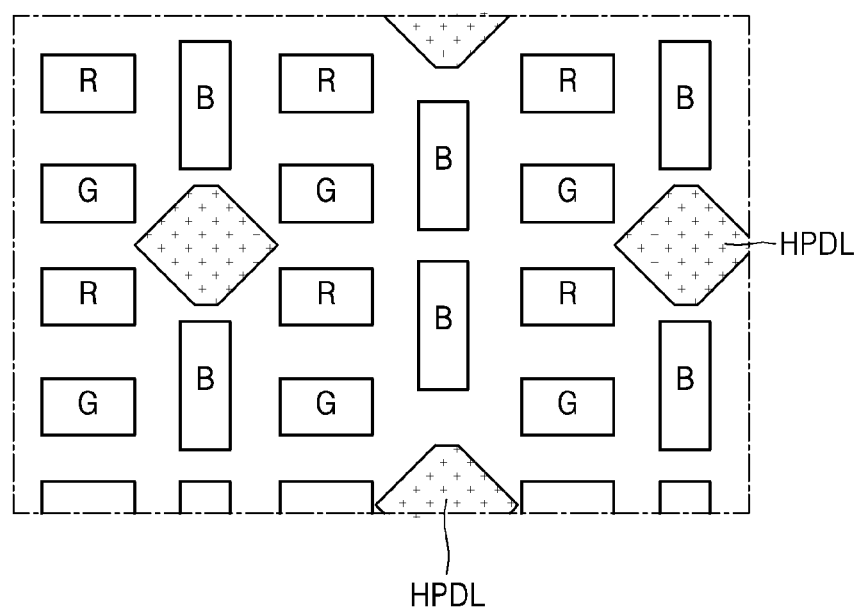
FIG. 4 illustrates a top view of an organic light-emitting display apparatus according to another embodiment.

FIG. 4 illustrates a top view of an organic light-emitting display apparatus according to another embodiment. In FIG. 4, like reference numerals in FIGS. 1 and 2 refer to like elements, and the description thereof is not repeated for conciseness of the description.

As shown in FIG. 4, in the organic light-emitting display apparatus, the pixel-defining spacer HPDL may be formed in a hexagonal shape.

By forming the pixel-defining spacer HPDL in a hexagonal shape, a vacant space between pixels may be maximally used while maintaining a distance to a pixel as a predetermined gap, and thus a size of the pixel-defining spacer HPDL may be relatively large.

By forming the pixel-defining spacer HPDL in a hexagonal shape in the organic light-emitting display apparatus, a minimum distance to blue pixels B in the vertical direction may be maintained as about 9 μm, and a minimum distance to red and green pixels R and G in the horizontal direction may be maintained as about 9.6 μm.

The above-described numeric values as the distances to the blue, red, and green pixels B, R, and G are only illustrative, and embodiments are not limited thereto. In addition, the numeric values may be variously adjusted if the pixel-defining spacer HPDL is formed at the location described above.

Figure 5:
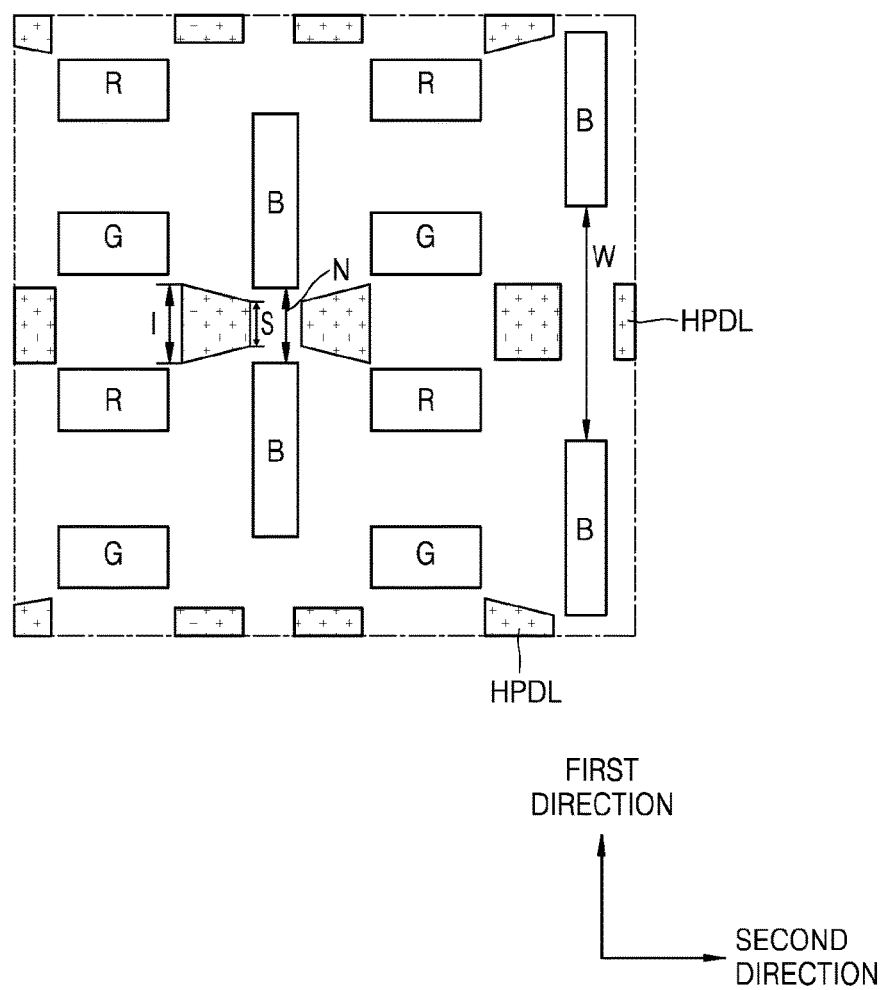
FIG. 5 illustrates a top view of an organic light-emitting display apparatus according to another embodiment.

FIG. 5 illustrates a top view of an organic light-emitting display apparatus according to another embodiment. In FIG. 5, like reference numerals in FIGS. 1 and 2 refer to like elements, and the description thereof is not repeated for conciseness of the description.

Unlike the pixel-defining spacers HPDL described above, a thin-film transistor array substrate according to one embodiment may include pixel-defining spacers HPDL having different shapes.

As shown in FIG. 5, the thin-film transistor array substrate may include pixel-defining spacers HPDL having two shapes in consideration of gaps between red, green, and blue pixels R, G, and B.

As described above, gaps between two neighboring blue pixels B maintain the relatively wide gap W and the relatively narrow gap N. In this case, pixel-defining spacers HPDL of a quadrilateral shape may be formed between two blue pixels B maintaining the relatively wide gap W, and pixel-defining spacers HPDL of a trapezoidal shape may be formed between two blue pixels B maintaining the relatively narrow gap N.

Accordingly, sizes and the number of pixel-defining spacers HPDL may be maximally formed while maintaining a maximum distance between the pixel-defining spacers HPDL and neighboring pixels.

The pixel-defining spacers HPDL formed between two neighboring blue pixels B maintaining the relatively narrow gap N may be formed in a trapezoidal shape, and as shown in FIG. 5, the pixel-defining spacers HPDL may be formed such that the topside "s" that is a short side is located between two blue pixels B and the bottom side "l" that is a long side is located between a green pixel G and a red pixel R.

The pixel-defining spacers HPDL are formed by considering that a gap between two blue pixels B is relatively narrow, whereas a gap between a green pixel G and a red pixel R is relatively wide.

The pixel-defining spacers HPDL may be formed in a trapezoidal shape such that the topside s that is a short side of each pixel-defining spacer HPDL is located between two blue pixels B to maximally maintain a gap between the pixel-defining spacers HPDL and the two blue pixels B and the bottom side 1 that is a long side of each pixel-defining spacer HPDL is located between a green pixel G and a red pixel R.

The pixel-defining spacer HPDL may be formed of a trapezoidal shape even between two blue pixels B maintaining the relatively narrow gap N in consideration of a location where the pixel-defining spacer HPDL moves vertically or horizontally while maximally using gaps between red, green, and blue pixels R, G, and B.

Referring to FIG. 5, a pixel-defining spacer HPDL of a quadrilateral shape may be formed between two blue pixels B maintaining the relatively wide gap W. The quadrilateral shape of the pixel-defining spacer HPDL is not limited, and any quadrilateral shape may be applied.

In addition, as shown in FIG. 5, the pixel-defining spacer HPDL may be divided into two pixel-defining spacers HPDL of a quadrilateral shape.

Accordingly, on the thin-film transistor array substrate, a size of each pixel-defining spacer HPDL may be maximally formed within a range of maintaining a gap, and the number of pixel-defining spacers HPDL may also be maximized.

As described above, according to the one or more embodiments, by forming a pixel-defining spacer using a space between pixels, a deposited object stabbing problem and a partial shock problem may be prevented.

It should be understood that the embodiments described herein should be considered in a descriptive sense only and not for purposes of limitation. Descriptions of features or aspects within each embodiment should typically be considered as available for other similar features or aspects in other embodiments.

While certain embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
    a thin-film transistor on a substrate;
    a planarization layer on the thin-film transistor; and
    a pixel-defining spacer on the planarization layer,
    a plurality of pixels of a first color disposed in a first row along a first direction,
    a plurality of pixels of a second color and a plurality of pixels of a third color alternatively disposed in a second row along the first direction,
    wherein the pixel-defining spacer defines a pixel area and is between adjacent two pixels among the plurality of pixels of the first color,
    wherein a first gap between first two adjacent pixels of the first color and a second gap between second two adjacent pixels of the first color are alternately and regularly formed, wherein a width of the first gap is wider than a width of the second gap,
    wherein the pixel-defining spacer is formed in a region of the first gap, and the pixel-defining spacer is not formed in a region of the second gap.

2. The organic light-emitting display apparatus of claim 1, wherein the first color is blue.

3. The organic light-emitting display apparatus of claim 2, wherein the pixel-defining spacer is between two pixels of the second color adjacent in a second direction and between two pixels of the third color adjacent in the second direction, wherein the second direction is perpendicular to the first direction.

4. The organic light-emitting display apparatus of claim 1, wherein the pixel-defining spacer is rectangular shaped.

5. The organic light-emitting display apparatus of claim 1, wherein the pixel-defining spacer is lozenge shaped.

6. The organic light-emitting display apparatus of claim 5, wherein the pixel-defining spacer is spaced apart from the pixels of the first color by at least about 8 μm.

7. The organic light-emitting display apparatus of claim 5, wherein the pixel-defining spacer is spaced apart from pixels of the second or the third color by at least about 9.2 μm.

8. The organic light-emitting display apparatus of claim 1, wherein the pixel-defining spacer is hexagonal shaped.

9. The organic light-emitting display apparatus of claim 8, wherein the pixel-defining spacer is spaced apart from the pixels of the first color by at least about 9 μm.

10. The organic light-emitting display apparatus of claim 8, wherein the pixel-defining spacer is spaced apart from pixels of the second or the third color by at least about 9.6 μm.

11. The organic light-emitting display apparatus of claim 1, wherein the pixel-defining spacer is not disposed in the second row.

12. An organic light-emitting display apparatus comprising:
    a thin-film transistor on a substrate;
    a planarization layer on the thin-film transistor; and
    a pixel-defining spacer on the planarization layer,
    a plurality of pixels of a first color disposed in a first row along a first direction,
    a plurality of pixels of a second color and a plurality of pixels of a third color alternatively disposed in a second row along the first direction,
    wherein the pixel-defining spacer defines a pixel area and is between adjacent two pixels among the plurality of pixels of the first color,
    wherein a first gap between first two adjacent pixels of the first color and a second gap between second two adjacent pixels of the first color are alternately and regularly formed, wherein a width of the first gap is wider than a width of the second gap,
    wherein the pixel-defining spacer is formed in different shapes in a region of the first gap and in a region of the second gap, and
    wherein the pixel-defining spacer in the region of the second gap increases in width along the first direction from the first row to the second row.

13. The organic light-emitting display apparatus of claim 12, wherein the pixel-defining spacer is trapezoid shaped in the region of the second gap.

14. The organic light-emitting display apparatus of claim 13, wherein a top of the trapezoid shaped pixel-defining spacer is located between the two adjacent pixels of the first color, and a bottom of the trapezoid shaped pixel-defining spacer is located between adjacent pixels of the second and the third color.

15. The organic light-emitting display apparatus of claim 12, wherein the pixel-defining spacer is quadrilateral shaped in the region of the first gap.

* * * * *